United States Patent [19]
Asanasavest

[11] Patent Number: 5,611,478
[45] Date of Patent: Mar. 18, 1997

[54] LEAD FRAME CLAMP FOR ULTRASONIC BONDING

[75] Inventor: Chainarong Asanasavest, Santa Clara, Calif.

[73] Assignee: National Semiconductor Corporation, Santa Clara, Calif.

[21] Appl. No.: 613,022

[22] Filed: Mar. 11, 1996

[51] Int. Cl.$^6$ .................................................. H01L 21/607
[52] U.S. Cl. ...................... 228/110.1; 228/212; 228/44.7
[58] Field of Search ............................ 228/110.1, 180.21, 228/212, 1.1, 44.7, 49.5

[56] References Cited

U.S. PATENT DOCUMENTS

| | | | |
|---|---|---|---|
| 4,583,676 | 4/1986 | Pena et al. | 228/4.5 |
| 4,821,945 | 4/1989 | Chase et al. | 228/44.7 |
| 4,951,120 | 8/1990 | Hagiwara et al. | 357/70 |
| 5,035,034 | 7/1991 | Cotney | 228/4.5 |
| 5,193,733 | 3/1993 | You | 228/49.5 |

Primary Examiner—Samuel M. Heinrich
Attorney, Agent, or Firm—Hickman Beyer & Weaver

[57] ABSTRACT

A lead frame clamping arrangement for lead frame/interposer bonding is disclosed that clamps the leads to be bonded at two spaced apart locations with the bonding area being positioned between the clamped portions of the particular leads being bonded. During bonding of a selected lead to its associated trace, a bonding tool tip is positioned in the gap between the clamps. In a preferred embodiment of the invention, the clamping arrangement includes a lead tip clamp and a lead arm clamp. In some embodiments, the lead arm clamp takes the form of a window clamp and the lead tip clamp includes a spring plate positioned within the window such that a channel shaped gap is formed between the spring plate and the window clamp. The gap exposes the bonding regions of all of the leads to be attached to the interposer. With this arrangement, all of the leads of a radially based lead frame can be secured to the interposer without requiring the resetting of the clamp.

16 Claims, 4 Drawing Sheets

LEAD FRAME CLAMP FOR ULTRASONIC BONDING

BACKGROUND OF THE INVENTION

The present invention relates generally to the bonding of an interposer with a lead frame in semiconductor packaging applications. More particularly, an improved method and apparatus for maintaining contact between the interposer and lead frame during single point bonding is disclosed.

In semiconductor packaging, lead frames are commonly used to couple a die to external components. In some applications (particularly small high lead count packages), it may be desirable or necessary to use an interposer in conjunction with the lead frame. The interposer is similar to a mini printed circuit board having traces. The lead frame is ultrasonically bonded directly onto underlying traces on an interposer, and the bonding pads on the dies are electrically coupled to the other end of the trace using bonding wires. One end of each bonding wire is typically ultrasonically bonded to a die pads on the die and the opposite end is typically bonded to an associated lead.

During an ultrasonic bonding process, the quality of the bond formed between the bonding surfaces is a major concern. This concern is especially acute during lead frame-interposer integration where high power bonding is necessary. High power is required to transfer the ultrasonic energy through the thick lead to the underlying interposer trace. In high power bonding, it is difficult to maintain contact between the bonding surfaces, the lead and the interposer trace. Any deviation in the quality of the contact between the bonding surfaces directly affects the bond quality.

Referring to FIG. 1, a conventional approach to providing a lead frame clamp during lead frame-interposer integration, generally designated by reference numeral 100, will be described. The lead frame clamp 100, which is in the form of a window clamp, includes a contact section 16 having a window hole 18, two support sections 14, and a plurality of fasteners. Each fastener is in the form of a fastener hole 12 and a screw or rivet 13. During the bonding process, screws or rivets 13 are inserted into the fastener holes 12, and the fasteners are attached to and support the support sections 14 in a fixed position. The support sections 14 are attached to and support the contact section 16 in a fixed position so that the contact section 16 touches and applies pressure to an area of the lead frame that includes the lead tips. A portion of the lead tip ends are left exposed by the window hole 18 and are not covered by the contact section 16. While pressure is being applied by the contact section 16 to the lead frame and underlying interposer, the exposed lead tips are bonded to the traces on the interposer.

Unfortunately, these conventional lead frame clamps possess certain drawbacks. First, the amount of movement of a lead is higher for a lead with an axis that lies in a direction perpendicular to the bonding tool's movement than for a parallel lead. This difference in movement results in higher attenuation of the ultrasonic energy for the perpendicular lead than for the parallel lead. This difference in attenuation dictates that the optimal bonding power for the parallel leads is greater than the optimal bonding power for the perpendicular leads. However, when the bonding power is high, and ultrasonic energy is applied for a longer period than is necessary to facilitate bonding, the interposer traces are more likely to break or the bond itself may be destroyed during bonding. Second, since the perpendicular leads easily move during bonding, the resulting bond quality is adversely affected. Third, if the bonding power is high enough, the vibration resonance on previously bonded points may be high enough to destroy these bonds. These three problems illustrate the need to improve the stability of the lead frame and the interposer during the bonding process. Thus, an improved clamping mechanism would be desirable.

SUMMARY OF THE INVENTION

To achieve the foregoing and other objects and according to the purpose of the present invention, a lead frame clamping arrangement is disclosed that clamps the leads to be ultrasonically bonded at two spaced apart locations. In one preferred embodiment, the clamping arrangement includes a lead arm clamp and a lead tip clamp that are spaced such that an exposed bonding area of a selected lead is positioned between the first and second segments of the selected lead. During bonding of the selected lead to its associated trace, a bonding tool tip may be positioned over the exposed bonding area to facilitate coupling the selected lead to its associated trace in the exposed bonding area. In one embodiment of the invention, the lead tip clamp includes a spring plate. In another preferred embodiment of the invention, the lead arm clamp is in the form of a window clamp which includes a window and the spring plate is positioned within the window hole while associated leads of the lead frame are being coupled to associated bonding pads on the interposer. In another aspect of the invention, a wire bonder that utilizes the described clamp is disclosed.

In a method aspect of the invention first and second portions of a lead frame lead are clamped. A bonding tool is then positioned over a third portion of the lead (the bonding area) that is positioned between the first and the second portions of the lead. The third portion of the lead is then ultrasonically welded to an associated interposer trace while the first and second portions of the lead are securely held in place by their associated clamps. In one preferred embodiment, the clamps are arranged to hold a plurality of leads such that additional traces on the substrate are then bonded to their associated leads without releasing the lead tip clamp and without releasing the lead arm clamp.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

Figure 1:
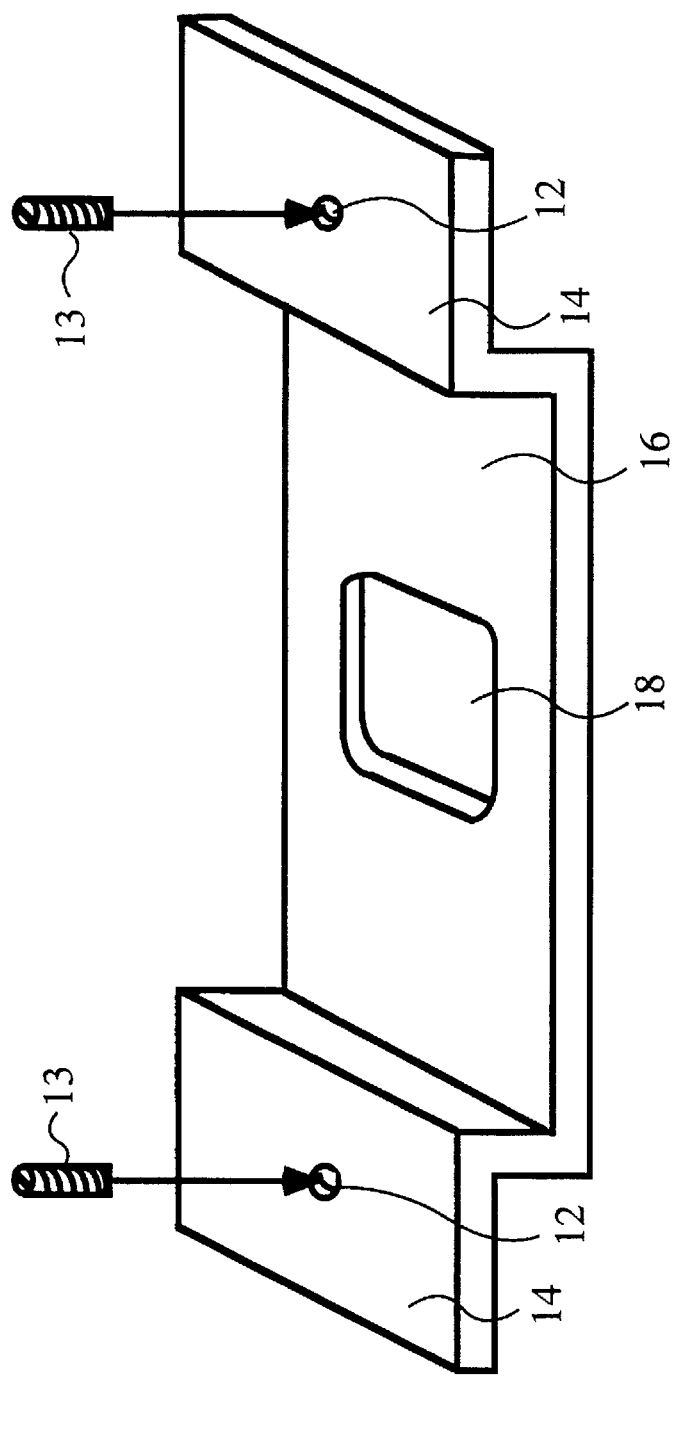
FIG. 1 is a diagrammatic perspective view of a conventional lead frame clamp.
Figure 2:
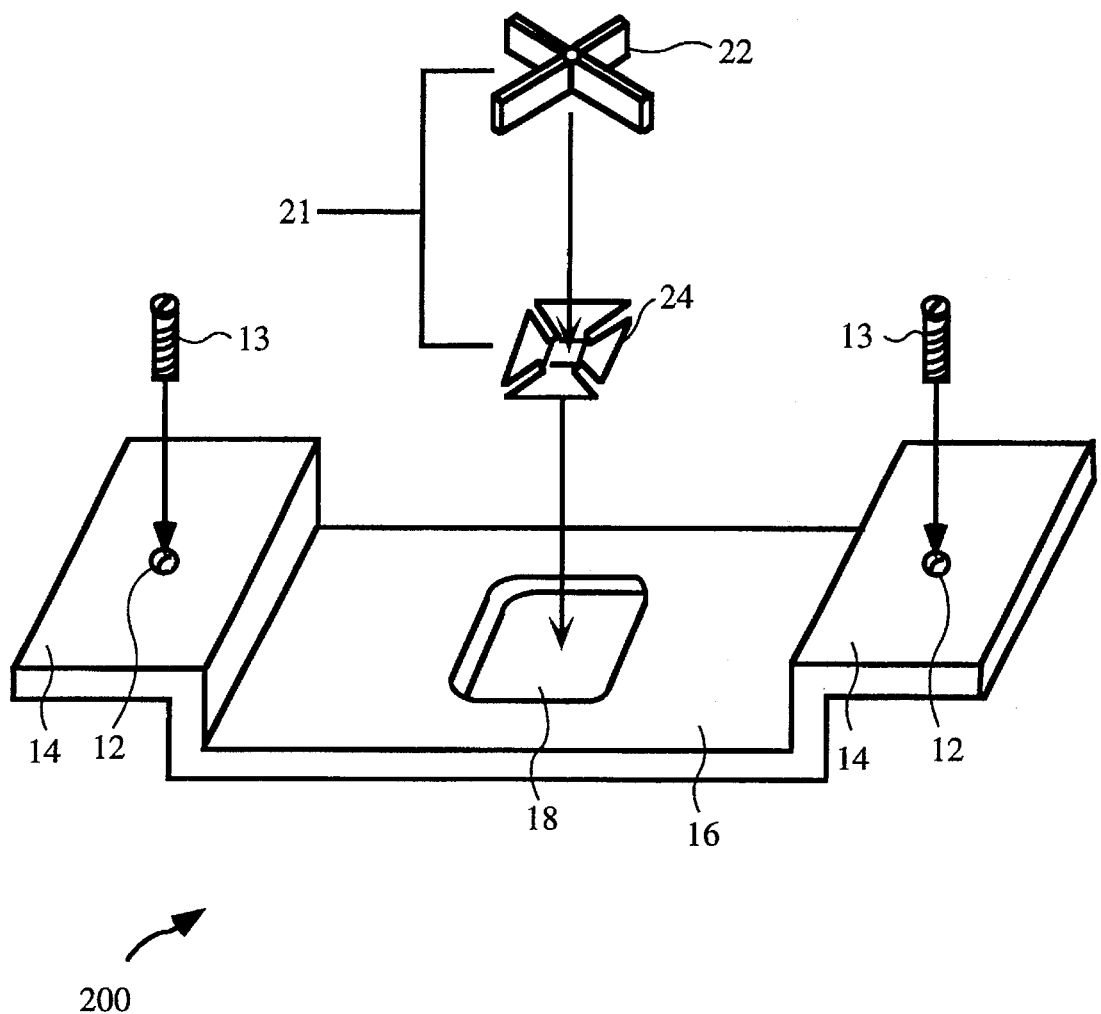
FIG. 2 is a diagrammatic exploded perspective view of a lead frame clamp made in accordance with one embodiment of the present invention.
Figure 3:
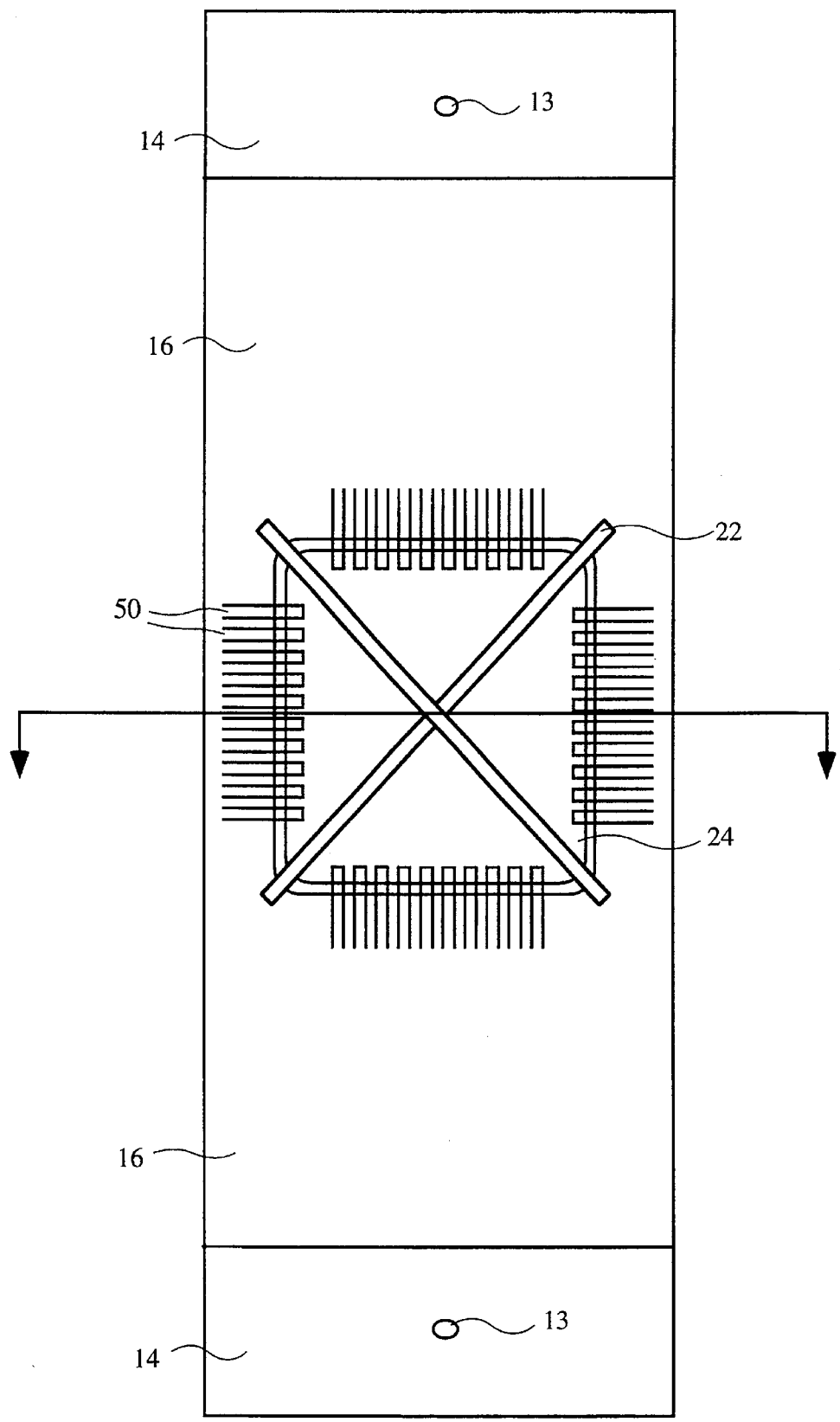
FIG. 3 is a diagrammatic top view of the embodiment of FIG. 2 which further shows the lead frame and interposer configuration during the bonding process in accordance with the present invention.
Figure 4:
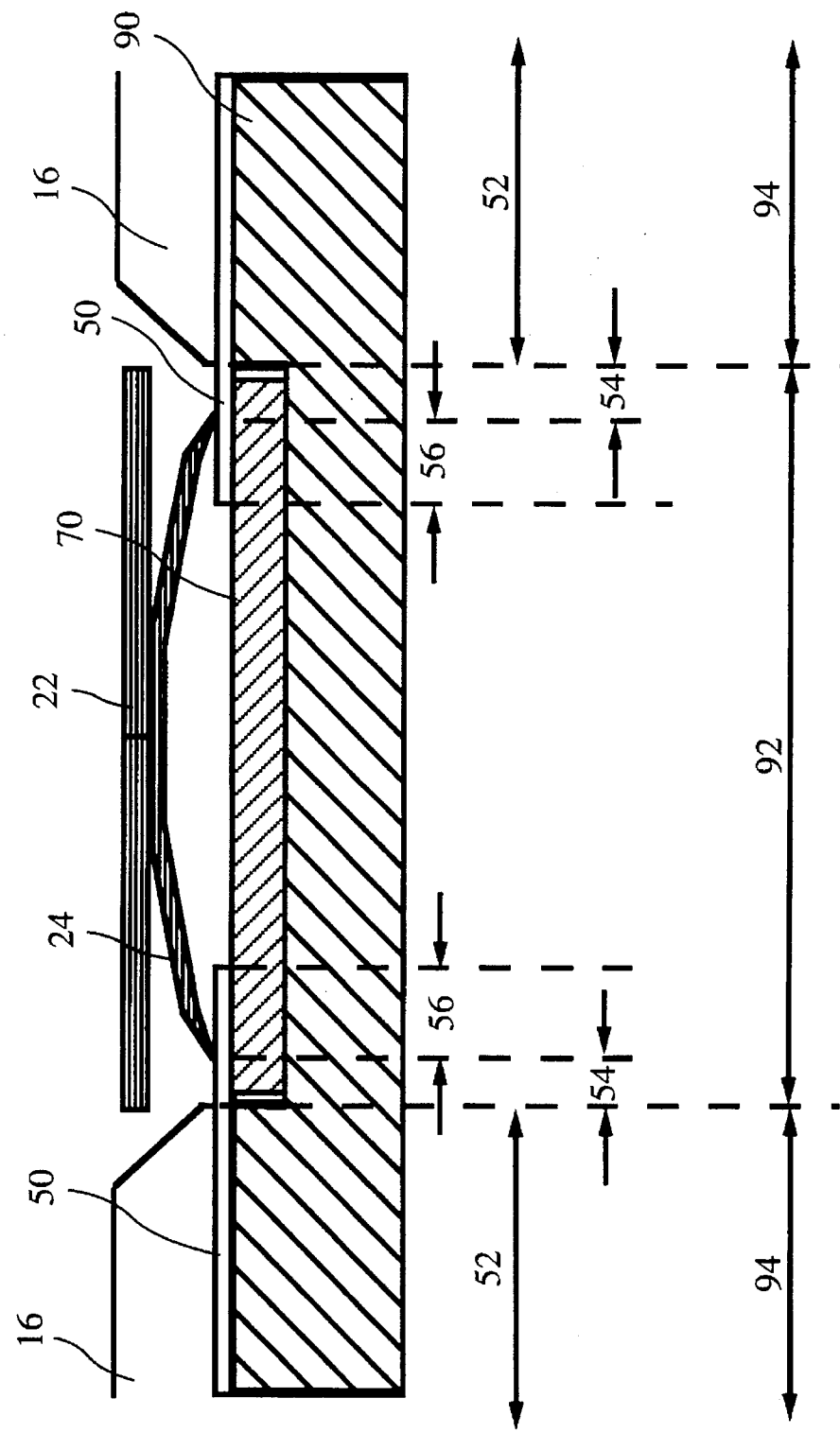
FIG. 4 is a cross-sectional side view of the embodiment of FIG. 3.

Lead frame clamps made in accordance with one embodiment of the present invention are shown in FIGS. 2, 3, and 4. FIG. 2 shows only a lead frame clamp, while FIGS. 3 and 4 depicts a lead frame clamp, as well as the lead frame and interposer, during an ultrasonic bonding process.

As best seen in FIG. 2, the embodiment shown is particularly well adapted for use in conjunction with lead frames having radially extending leads as is common in quad flat pack (QFP) and various other packaging configurations. In this embodiment, the lead frame clamp 200 has two clamping mechanisms: a lead arm clamp member 16 and a lead tip clamp member 21. Additionally, the lead frame clamp includes fasteners 13 which are provided to secure the lead frame clamp to a support member during bonding. Preferably, the lead arm clamp 16 is in the form of a window clamp that clamps all of the radially extending leads, leaving their free standing lead tips exposed. This portion of the lead frame clamp is very similar to conventional window clamps and includes a window 18. The lead tip clamp 21 takes the form of a spring clamp that is positioned within the window 18 such that clamps the free ends of each of the leads tips that are exposed within the window 18. The spring clamp 21 is sized such that a channel or gap is formed around the spring clamp and between the spring clamp and the window clamp. The gap is sized to allow a bonding tool to fit between the spring and window clamps. The gap's size depends on many factors, such as the type of bonding tool used and the type of bonding being performed. For example, a gap size that's in the range of about 20 to 30 mils has been found to work well.

In the embodiment shown, the spring clamp 21 includes a spring plate 24 which is attached to and suspended from a holder 22. The window clamp 18 has a pair of arms 14 that extend in opposite directions from the window 18. One of the arms 14 of the window clamp 16 is attached to and supports the spring clamp, as well as the window clamp. More specifically, during the bonding process, the arms are affixed to a support member by the fasteners 13. One of the arms is attached to and supports the holder. The holder is attached to and positions the spring plate within the window 18 of the window clamp. As a result, the spring clamp supports and clamps the underlying lead frame.

The fasteners 13 may take any suitable forms that are capable of affixing the lead frame clamp 200 to a support member. By way of example, the fasteners 13 may take the form of screws or rivets. Each screw or rivet is inserted into a fastener hole 12 within each arm 14 of the window clamp and into a hole within a support member. By way of another example, the fasteners may take the form of steel balls that are held down by a spring plate. The steel balls, in turn, hold the lead frame clamp in place.

In summary, the lead frame clamp 200 configuration described above has two distinct clamping mechanisms for affixing and holding an underlying object, such as a lead frame: the window clamp 16 and the spring clamp 21. These clamping mechanisms are engaged when the lead frame clamp 200 is fastened to a support member. An application which implements these clamping mechanisms will be fully described below with reference to FIGS. 3 and 4.

In the described embodiment, the spring clamp 21 is attached via the holder 22 to one of the arms 14 of the window clamp 16. However, it should be appreciated that in other embodiments, the spring clamp and the window clamp may be two separate pieces. By way of example, the spring clamp may be attached to the same support member, to which the arms of the window clamp are attached. Additionally, the spring clamp and window clamp may take any suitable form that is capable of functioning as a clamping mechanism. By way of example, window clamp may take the shape of a single flat sheet.

During the bonding process, the spring clamp is positioned within the center of the window of the window clamp. The spring clamp is sized such that a channel or gap is formed around the spring clamp and between the spring clamp and the window clamp. The gap is sized to allow a bonding tool to fit between the spring and window clamps. The gap's size depends on many factors, such as the type of bonding tool used and the type of bonding being performed. For example, a gap size that's in the range of about 20 to 30 mils has been found to work well.

Turning next to FIGS. 3 and 4, the arrangement of the interposer, lead frame, and lead frame clamp in accordance with the present invention will be described in the context of a bonding process. The interposer 70 sits within a cavity 92 within a heat block 90 that serves at the support member for the lead frame clamp. The lead frame 50 is positioned directly over the interposer 70, and the leads of the lead frame 50 are positioned directly on the traces of the interposer 70. During the ultrasonic bonding process, the lead frame's 50 movement relative to the interposer 70 is restrained by the lead frame clamp at two contact locales. For example, the window clamp 16 contacts the inner portion of the lead tips 52, and the spring plate 24 contacts at a point on the outer portion of the lead tips 56. The distance 56 between the spring clamp's point of contact and the lead tip may be any suitable distance; for example, 40 mils works well. The portion of the leads 54 that is located between the two contact areas is left exposed. In sum, the window clamp and spring plate are positioned directly over the lead frame, and the lead frame overlaps the interposer and a portion of the heat block 94. While the lead frame is being restrained by the window clamp and spring plate, the leads are ultrasonically bonded to the traces on the interposer. This bonding occurs within the exposed 54 portion of the lead frame 50.

The method of ultrasonic bonding in accordance with the present invention and in reference to FIGS. 3 and 4 will now be described. Initially, the interposer 70 is positioned within a cavity 92 within the heat block 90. The heat block is then heated to catalyze the bonding process. The lead frame 50 is then placed upon the interposer 70 in an overlapping position. Next, the lead frame's movement relative to the interposer is restrained at two contact locales by the window clamp 16 and the spring plate 24. After the lead frame is restrained, a lead is ultrasonically bonded to an associated trace on the interposer. While the lead frame is still clamped in two places by the lead frame clamp, the remaining unbonded leads are bonded one at a time to their associated traces.

The method of packaging of a semiconductor device will now be briefly described. First, the lead frame is formed using any available conventional processes. An interposer having a plurality of traces is then formed. The method described above in regard to ultrasonic bonding is used to bond the leads of the lead frame to the traces of the interposer. After the leads are bonded to the traces of the interposer, a die with a plurality of bonding pads is affixed to the interposer. Next, the bonding pads of the die are electrically connected to the leads of the lead frame. The die, leads, and a portion of the interposer are encapsulated using conventional encapsulation materials. Conventional techniques are used to implement these steps for packaging the semiconductor device, as are well known to those of ordinary skill in the art.

Although only one embodiment of the present invention has been described, it should be understood that the present invention may be embodied in many other specific forms without departing from the spirit or scope of the invention. Particularly, the described device may be used in conjunction with a wide variety of bonding processes, in addition to the lead frame-interposer integration process used in the example. For instance, this improvement may be applicable for any bonding process where a lead is ultrasonically bonded to an underlying substrate. For example, a lead is welded to a printed circuit board. By way of another example, a lead frame is welded to a substrate which includes a ball grid array configuration as described in commonly assigned co-pending application Ser. No. 08/496,043, entitled "THERMAL BALL LEAD INTEGRATED PACKAGE" by Mostafazadeh et al., which is incorporated herein by reference in its entirety.

Additionally, the invention has been described in relation to one example of an ultrasonic bonding configuration and method. However, it should be understood that the same types of improvement would be found when using the invention in conjunction with any suitable bonding configurations and methods. For example, this invention may be used in conjunction with the lead frame-interposer integration bonding apparatus described in the applicant's co-pending application, Ser. No. 08/613,023, now U.S. Pat. No. 5,607,096, entitled "APPARATUS AND METHOD FOR ULTRASONIC BONDING LEAD FRAMES AND BONDING WIRES IN SEMICONDUCTOR PACKAGING APPLICATIONS" which is incorporated herein by reference in its entirety.

The invention has been described in conjunction with an example wherein the lead is ultrasonically welded at a single point to the trace of an interposer. It should be appreciated that the same types of improvement would be found when bonding at more than one point on the lead. Additionally, a particular window clamp and spring clamp structure and a lead frame clamp arrangement have been described. However, the actual construction and positioned of these clamps may widely vary. For example, the spring clamp and window clamp may be separate clamps that are not attached to one another. Additionally, the window clamp and the spring clamp may both be in the form of a conventional window clamp with the spring clamp placed inside the window clamp. Therefore, the present examples are to be considered as illustrative and not restrictive, and the invention is not to be limited to the details given herein, but may be modified within the scope of the appended claims.

I claim:

1. A lead frame clamp for holding a lead frame while a selected lead of the lead frame is being coupled to an associated trace on a substrate, the lead frame clamp comprising:

a lead tip clamp member for holding a first portion of the lead frame, including a first segment of the selected lead;

a lead arm clamp member for holding a second portion of the lead frame, including a second segment of the selected lead, the first segment of the selected lead being spaced apart from the second segment of the selected lead such that an exposed bonding area of the selected lead is positioned between the first and second segments of the selected lead;

a fastener arrangement for attaching the lead arm clamp to a support member; and whereby during bonding of the selected lead to its associated trace, a bonding tool tip may be positioned over the exposed bonding area to facilitate coupling the selected lead to its associated trace in the exposed bonding area.

2. A lead frame clamp as recited in claim 1 wherein the lead tip clamp includes a spring plate and a holder, the spring plate being secured to the holder such that when force is applied to the holder, force is transmitted from the holder to the spring plate so that the spring plate makes contact with the first portion of the lead frame.

3. A lead frame clamp as recited in claim 2 wherein the holder is attached to both the lead arm clamp and the spring plate such that when the fasteners secure the lead arm clamp to the support member, the fasteners draw the spring plate firmly against the first portion of the lead frame.

4. A wire bonder for coupling leads of a lead frame to associated traces on a substrate, the wire bonder comprising:

a lead frame clamp as recited in claim 1;

an ultrasonic transducer;

a bonding tool arranged to be driven by the transducer such that actuation of the transducer will cause movement of the bonding tool; and a signal generator for applying drive signals to the transducer to mechanically bond a selected one of the substrate traces to an associated one of the lead frame leads, the signal generator being arranged to permit actuation of the transducer at frequencies suitable for ultrasonic bonding.

5. A lead frame clamp as recited in claim 2 wherein the lead arm clamp is a window clamp having a window therein and the spring plate is positioned within the window such that during use, the spring plate holds a multiplicity of lead tips while associated leads of the lead frame are being coupled to associated bonding pads on the interposer.

6. A lead frame clamp as recited in claim 1 wherein a distance between the first portion of the lead frame and the second portion of the lead frame is in the range of about 20 to 30 mils.

7. A lead frame clamp as recited in claim 1 wherein a distance between the first portion of the lead frame and a lead tip of the lead frame is greater than about 40 mils.

8. A lead frame clamp as recited in claim 1 wherein the substrate is one selected from a group consisting of an interposer, a printed circuit board, and a substrate having traces thereon.

9. A method of attaching a lead of a lead frame to an associated trace on a substrate, the method comprising the steps of:

(a) clamping a first portion of the lead frame lead at a first contact position;

(b) clamping a second portion of the lead frame lead at a second contact position;

(c) positioning a bonding tool over a bonding area that includes a third portion of the lead that is positioned between the first and the second portions of the lead, the bonding tool being attached to an ultrasonic transducer; and (d) ultrasonically bonding the third portion of the lead to an associated trace on the substrate, the bonding being performed while the first and second portions on the lead are clamped.

10. A method as recited in claim 9 wherein the first and second clamping steps are each arranged to clamp a plurality of leads, the method further comprising the steps of ultrasonically bonding additional leads of the lead frame to associated additional traces on the substrate without releasing the first or second clamps.

11. A method as recited in claim 9 wherein the first contact position is a first distance from a lead tip of the lead and the second contact position is a second distance from the lead tip of the lead, the first distance being greater than the second distance.

12. A method as recited in claim 11 wherein a difference between the first and second distances is in the range of about 10 to 50 mils.

13. A method as recited in claim 9 wherein at least one of the substrate traces and the bonding area is plated with a material selected from a group consisting of gold and silver.

14. A method as recited in claim 9 wherein the substrate is one selected from a group consisting of an interposer, a printed circuit board, and a substrate having traces thereon.

15. A method for packaging an integrated circuit die having a plurality of bond pads, comprising the steps of:

(a) forming a lead frame having a plurality of leads;

(b) forming an interposer having a plurality of traces thereon, the interposer defining a die attach area;

(c) placing said lead frame directly over said interposer such that each lead is aligned directly over one of the plurality of traces on the interposer;

(d) clamping a first portion of the lead frame lead at a first contact position;

(e) clamping a second portion of the lead frame lead at a second contact position;

(f) positioning a bonding tool over a bonding area that includes a third portion of the lead that is positioned between the first and the second portions of the lead, the bonding tool being attached to an ultrasonic transducer;

(g) ultrasonically bonding the third portion of the lead to an associated trace on the interposer while the first and the second portions of the lead are clamped;

(h) ultrasonically bonding a first end of a bonding wire to an associated one of the bond pads, wire bonding a second end of the bonding wire to an associated lead;

(i) repeating said steps (g) and (h) as necessary to connect additional traces on the substrate to associated additional leads and to connect additional bonding pads on the die to associated additional leads;

(j) affixing a die in the die attach area; and (k) encapsulating the die, bonding wires, interposer, and inner portion of the lead frame to form a protective package.

16. A method as recited in claim 15 wherein the first contact position is a first distance from a lead tip of the lead and the second contact position is a second distance from the lead tip of the lead, the first distance being greater than the second distance and a difference between the first and second distances being in the range of about 20 to 60 mils.

* * * * *